United States Patent
Schneider (10) Patent No.: US 9,842,796 B2
(45) Date of Patent: Dec. 12, 2017

(54) ELECTRONIC MODULE INCLUDING A DEVICE FOR DISSIPATING HEAT GENERATED BY A SEMICONDUCTOR UNIT SITUATED IN A PLASTIC HOUSING AND METHOD FOR MANUFACTURING AN ELECTRONIC MODULE

(71) Applicant: Robert Bosch GmbH, Stuttgart (DE)

(72) Inventor: Thomas Schneider, Monheim am Rhein (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/317,140

(22) PCT Filed: Jun. 8, 2015

(86) PCT No.: PCT/EP2015/062635
§ 371 (c)(1),
(2) Date: Dec. 8, 2016

(87) PCT Pub. No.: WO2015/193129
PCT Pub. Date: Dec. 23, 2015

(65) Prior Publication Data
US 2017/0125326 A1 May 4, 2017

(30) Foreign Application Priority Data
Jun. 17, 2014 (DE) .................. 10 2014 211 524

(51) Int. Cl.
*H01L 23/495* (2006.01)
*H01L 23/433* (2006.01)

(52) U.S. Cl.
CPC .... *H01L 23/49568* (2013.01); *H01L 23/4334* (2013.01); *H01L 23/49537* (2013.01);
(Continued)

(58) Field of Classification Search
CPC ......... H01L 23/49568; H01L 23/49537; H01L 23/4948; H01L 23/49575; H01L 23/495; H01L 23/4334
(Continued)

(56) References Cited

U.S. PATENT DOCUMENTS 6,008,074 A 12/1999 Brand
2007/0267740 A1* 11/2007 Khan .................. H01L 23/3128
257/712

(Continued)

FOREIGN PATENT DOCUMENTS

DE 102004021838 A1 9/2005
DE 102010030838 A1 1/2012
(Continued)

OTHER PUBLICATIONS

International Search Report dated Sep. 9, 2016, of the corresponding International Application PCT/EP2015/062635 filed Jun. 8, 2016.

*Primary Examiner* — Alexander Oscar Williams
(74) *Attorney, Agent, or Firm* — Norton Rose Fulbright US LLP; Gerard Messina (57) ABSTRACT

An electronic module including a semiconductor unit situated in a plastic housing, an electrically conductive plate system, via which the semiconductor unit may be supplied with electrical power, the electrically conductive plate system being connected in a planar fashion to a heat-generating integrated circuit of the semiconductor unit via a heat coupler; and the electrically conductive plate system being designed in such a way that it dissipates the heat generated by the heat-generating integrated circuit of the semiconductor unit to the plastic housing. A method for manufacturing a corresponding electronic module is also described.

17 Claims, 4 Drawing Sheets

(52) U.S. Cl.
CPC .. *H01L 23/49548* (2013.01); *H01L 23/49575* (2013.01); *H01L 2924/0002* (2013.01)

(58) Field of Classification Search
USPC ....... 257/713, 712, 675, 717, 721, 707, 708, 257/704
See application file for complete search history.

(56) References Cited

U.S. PATENT DOCUMENTS

| | | | |
|---|---|---|---|
| 2007/0290322 A1* | 12/2007 | Zhao | H01L 23/367 257/690 |
| 2009/0072360 A1 | 3/2009 | Koga | |
| 2016/0066414 A1* | 3/2016 | Jow | H01L 23/5286 361/767 |
| 2017/0150650 A1* | 5/2017 | Spiel | H05K 7/20436 |

FOREIGN PATENT DOCUMENTS

| | | |
|---|---|---|
| WO | 2010081465 A2 | 7/2010 |
| WO | 2014019780 A1 | 2/2014 |

* cited by examiner

ELECTRONIC MODULE INCLUDING A DEVICE FOR DISSIPATING HEAT GENERATED BY A SEMICONDUCTOR UNIT SITUATED IN A PLASTIC HOUSING AND METHOD FOR MANUFACTURING AN ELECTRONIC MODULE

FIELD

The present invention relates to an electronic module including a device for dissipating heat generated by a semiconductor unit situated in a plastic housing and a method for manufacturing an electronic module.

BACKGROUND INFORMATION

Presently, the heat dissipation in electronic control units, which have a relatively high power loss in comparison to the overall size, is generally controlled by the selection of the housing material. As a housing material, aluminum has advantageous properties with respect to the heat dissipation, but aluminum is more costly than plastic. If plastic is to be used as a housing material, it is usually necessary to significantly increase the overall size of the control unit, to achieve sufficient heat dissipation. In order that the heat may be dissipated from the control unit, good heat conduction is required between the control unit and the surroundings. However, plastic conducts heat poorly, so that the location of the heat input becomes relatively hot and the surfaces in the immediate proximity of the heat input exhibit only little heat dissipation. As a result, a simple enlargement of the housing surface does not always bring about an improvement with respect to the heat dissipation.

If the thermal connection of the heat source to the housing may be provided over a large area, then a plastic housing may also dissipate sufficient heat. This may be achieved, for example, in that the heat source is connected to a heat spreader, for example, an aluminum plate, and the heat spreader is connected over a large area to the housing. It is disadvantageous in this case that a separate heat spreader is necessary and has to be introduced into the housing in an additional work step.

German Patent Application No. DE 20 2009 000 615 U1 describes a power semiconductor element potted in molding compound, in which a power semiconductor including metallic contacts, which are led to the outer side of a mold module, is enclosed in enveloping injection using thermosetting plastics, and a heat conduction section through the semiconductor and a substrate carrier is provided for heat dissipation of a bottom side, a contact tab, which is formed covering the surface of the contacts, is attached in the area of one of the contacts of the semiconductor on its upper side, and a heat-conducting element is provided on the planar section of the contact tab in a way which conducts heat to the upper side of the mold module, to form a second heat-conductive bridge on the outer side of the module.

SUMMARY

The present invention provides an electronic module including a semiconductor unit situated in a plastic housing, an electrically conductive plate system, via which the semiconductor unit may be supplied with electrical power, the electrically conductive plate system being connected in a planar fashion to a heat-generating integrated circuit of the semiconductor unit via a heat coupler, and the electrically conductive plate system being designed in such a way that it dissipates heat generated by the heat-generating integrated circuit of the semiconductor unit to the plastic housing.

The present invention furthermore provides a method for manufacturing an electronic module. The method includes electrically connecting an electrically conductive plate system to a semiconductor unit, the electrically conductive plate system supplying the semiconductor unit with electrical power, planar connection of the electrically conductive plate system to a heat-generating integrated circuit of the semiconductor unit via a heat coupler, and extrusion coating of the electrically conductive plate system, which is connected via the heat coupler to the heat-generating integrated circuit of the semiconductor unit, to form a plastic housing, the electrically conductive plate system dissipating the heat generated by the heat-generating integrated circuit of the semiconductor unit to the plastic housing.

In accordance with the present invention, the already present electrically conductive plate system is used as a heat spreader. Therefore, the electrically conductive plate system may be used both for providing electrical power to the semiconductor unit and for dissipating heat generated by the semiconductor unit to the plastic housing.

Advantageous specific embodiments and refinements result from the description herein with reference to the figures.

It is preferably provided that the electrically conductive plate system has a plurality of electrically conductive plate elements, which are each at least partially extrusion coated using the plastic housing and cover a substantially predominant part of an area of at least one wall of the plastic housing, which is opposite to the heat-generating integrated circuit of the semiconductor unit. Due to the large-area formation of the electrically conductive plate system in relation to the housing, it may therefore be used optimally for the heat dissipation of the semiconductor unit.

Preferably, it is furthermore provided that the plurality of electrically conductive plate elements covers at least 50%, preferably at least 80%, of the area of at least the wall of the plastic housing opposite to the heat-generating integrated circuit of the semiconductor unit. The area of the plurality of electrically conductive plate elements in relation to the at least one wall of the plastic housing may therefore advantageously be adapted to structural requirements, for example, a required heat dissipation of the semiconductor unit.

According to another preferred embodiment, it is provided that a first part of the plurality of electrically conductive plate elements has a first area and a second part of the plurality of electrically conductive plate elements has a second area, the second area being formed larger than the first area. Therefore, for example, a ground line of the electrically conductive plate system may be provided over a large area and the remaining conductors of the electrically conductive plate system may be dimensioned in such a way that they have a smaller area.

According to another preferred exemplary embodiment, it is provided that the plurality of electrically conductive plate elements is situated at a first end on an outer side of the plastic housing in a plug area of the plastic housing and is electrically connected at a second end to terminals of the semiconductor unit. Therefore, a total length of the plurality of electrically conductive plate elements may be used both for the power supply of the semiconductor unit and also for heat dissipation of the heat generated by the semiconductor unit to the plastic housing.

It is preferably furthermore provided that the electrically conductive plate system has a plurality of electrically conductive plate elements, a first part of the plurality of electrically conductive plate elements being designed in such a way that they supply the semiconductor unit with electrical power and a second part of the plurality of electrically conductive plate elements being designed in such a way that they supply the semiconductor unit with electric power and dissipate heat generated by the semiconductor unit to the plastic housing. The first part of the plurality of electrically conductive plate elements is therefore advantageously used for the electrical power supply of the semiconductor unit. The second part of the plurality of electrically conductive plate elements advantageously has both the function of the electrical power supply of the semiconductor unit and also the function of the heat dissipation of the heat generated by the semiconductor unit to the housing. The second part of the plurality of electrically conductive plate elements may be formed by a ground line, for example. This may be formed having a large area, whereby good heat dissipation of the heat generated by the semiconductor unit to the plastic housing is enabled.

According to another preferred exemplary embodiment, it is provided that the electrically conductive plate system has a first plate system, which is designed in such a way that it supplies the semiconductor unit with electrical power, and has a second plate system, which is situated separately from the first plate system, and which is designed in such a way that it dissipates heat generated by the semiconductor unit to the plastic housing. The first plate system therefore advantageously has the function of the electrical power supply of the semiconductor unit. The second plate system, which is separate from the first plate system, advantageously has the function of heat dissipation of the heat generated by the semiconductor unit to the housing.

According to another preferred exemplary embodiment, it is provided that the first plate system has a plurality of electrically conductive plate elements, which are each at least partially extrusion coated using the plastic housing, the plurality of electrically conductive plate elements being situated at a first end on an outer side of the plastic housing in a plug area of the plastic housing and being electrically connected at a second end to terminals of the semiconductor unit. The first plate system may therefore preferably be used for the power supply of the semiconductor unit.

It is preferably furthermore provided that the second plate system is at least partially extrusion coated using the plastic housing and covers a substantially predominant part of an area of at least one wall of the plastic housing opposite to the heat-generating integrated circuit of the semiconductor unit. Due to the large-area formation of the second plate system in relation to the housing, it may therefore be optimally used for heat dissipation of the heat generated by the semiconductor unit.

According to another preferred exemplary embodiment, it is provided that the second plate system covers at least 50%, preferably at least 80%, of the area of at least the wall of the plastic housing opposite to the heat-generating integrated circuit of the semiconductor unit. The area of the second plate system in relation to the at least one wall of the plastic housing may therefore advantageously be adapted to structural requirements, for example, a required heat dissipation of the semiconductor unit.

According to another preferred embodiment, it is provided that the electrically conductive plate system is released from the plastic housing in a thermal connection area to the heat coupler. Due to the release of the electrically conductive plate system in the thermal connection area, a connection of the electrically conductive plate system to the semiconductor unit may advantageously be carried out via the heat coupler.

According to another preferred exemplary embodiment, it is provided that the electrically conductive plate system is formed by a lead frame. Because the lead frame is already extrusion coated by the plastic housing or is integrated therein in the scope of the manufacturing during the manufacturing of the plastic housing, it may provide both the function of the electrical power supply of the semiconductor unit and also the function of the heat dissipation of the heat generated by the semiconductor unit to the plastic housing.

According to another preferred exemplary embodiment, it is provided that the heat coupler is formed by a heat conducting gel or a heat pad. Efficient heat transfer may thus be provided between the semiconductor unit and the electrically conductive plate system.

Furthermore, it is preferably provided that the semiconductor unit is formed by a circuit board and the integrated circuit situated on the circuit board. The heat dissipation power of the electronic module may therefore advantageously be adapted to a size of the semiconductor unit.

The described embodiments and refinements may be combined with one another as desired.

Further possible embodiments, refinements, and implementations of the present invention also include combinations, which are not explicitly mentioned, of features of the present invention which are described above or hereafter with respect to the exemplary embodiments.

BRIEF DESCRIPTION OF THE DRAWINGS

The figures provide further understanding of the specific embodiments of the present invention. They illustrate specific embodiments and are used in conjunction with the description to explain principles of the present invention.

Other specific embodiments and many of the mentioned advantages result with regard to the figures. The illustrated elements of the figures are not necessarily shown to scale in relation to one another.

DETAILED DESCRIPTION OF EXAMPLE EMBODIMENTS

In the figures, identical reference numerals identify identical or functionally identical elements, parts, or components, if not otherwise indicated.

Figure 1A:
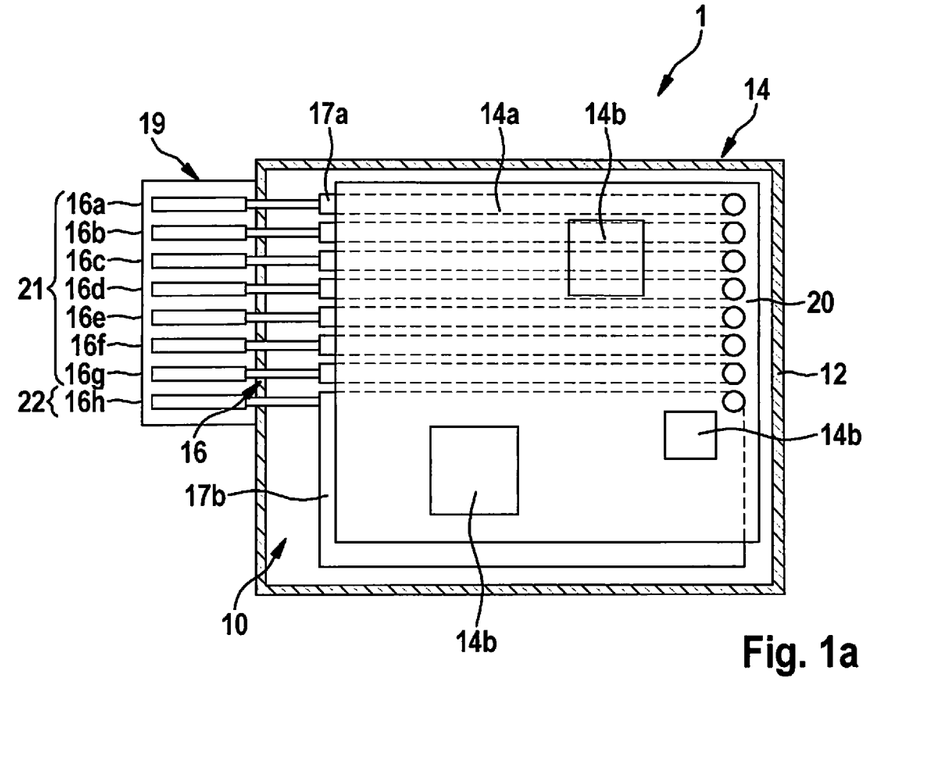
FIG. 1a shows a schematic view of an electronic module according to the present invention including a device for heat dissipation of heat generated by a semiconductor unit situated in a plastic housing, according to a first specific embodiment of the present invention.

FIG. 1a shows a schematic view of an electronic module according to the present invention including a device for heat dissipation of heat generated by a semiconductor unit situated in a plastic housing, according to a first specific embodiment of the present invention.

Electronic module 1 has a semiconductor unit 14, which is situated in a plastic housing 12, and a device 10 for heat dissipation of heat generated by semiconductor unit 14 situated in plastic housing 12. Device 10 for heat dissipation of semiconductor unit 14 situated in plastic housing 12 has an electrically conductive plate system 16, which both supplies semiconductor unit 14 with electrical power and also dissipates heat generated by semiconductor unit 14 to plastic housing 12. Electrically conductive plate system 16 is preferably formed by a lead frame. The lead frame preferably has multiple layers of metal strips, which are connected and/or stacked to form a lead frame packet. Alternatively, the lead frame may also be formed in a single layer.

Electrically conductive plate system 16 has a plurality of planar electrically conductive plate elements 16a, 16b, 16c, 16d, 16e, 16f, 16g, 16h. A first part 21 of the plurality of electrically conductive plate elements 16a, 16b, 16c, 16d, 16e, 16f, 16g, 16h has a first area 17a and a second part 22 of the plurality of electrically conductive plate elements 16a, 16b, 16c, 16d, 16e, 16f, 16g, 16h has a second area 17b, second area 17b being formed larger than first area 17a.

Electrically conductive plate system 16, which is formed by the plurality of planar electrically conductive plate elements 16a, 16b, 16c, 16d, 16e, 16f, 16g, 16h, is at least partially extrusion coated using plastic housing 12 and covers a substantially predominant part of an area of a wall of the plastic housing. Semiconductor unit 14 is formed by a circuit board 14a and application-specific integrated circuits 14b situated on circuit board 14a.

The plurality of electrically conductive plate elements 16a, 16b, 16c, 16d, 16e, 16f, 16g, 16h is situated at a first end on an outer side of plastic housing 12 in a plug region 19 and is electrically connected at a second end to terminals 20 of semiconductor unit 14.

The plurality of electrically conductive plate elements 16a, 16b, 16c, 16d, 16e, 16f, 16g, 16h preferably covers, according to the first specific embodiment of the present invention, at least 80% of the area of the at least one wall of plastic housing 12.

Figure 1B:
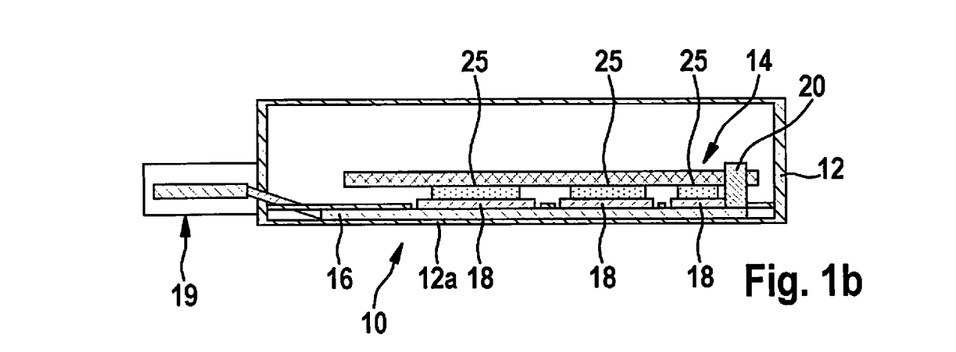
FIG. 1b shows a cross-sectional view of the electronic module according to the present invention including the device for heat dissipation of heat generated by the semiconductor unit situated in the plastic housing, according to the first specific embodiment of the present invention.

FIG. 1b shows a cross-sectional view of the electronic module according to the present invention including the device for heat dissipation of heat generated by the semiconductor unit situated in the plastic housing, according to the first specific embodiment of the present invention.

Electrically conductive plate system 16 is released in a thermal connection area 25 for thermal connection of electrically conductive plate system 16 to semiconductor unit 14 on an inner side of plastic housing 12. In the present first specific embodiment of the present invention, electrically conductive plate system 16 has three thermal connection areas 25. Alternatively, electrically conductive plate system 16 may also have another suitable number of connection areas 25.

Heat coupler 18, via which electrically conductive plate system 16 is connected to semiconductor unit 14, is provided at particular thermal connection areas 25. Heat coupler 18 is preferably formed by a heat conducting gel. Alternatively, heat coupler 18 may also be formed by a heat pad or other suitable heat coupling means.

Electrically conductive plate system 16 extends from plug area 19 into an inner area of plastic housing 12. Electrically conductive plate system 16 is extrusion coated using plastic housing 12 directly adjacent to plug area 19 in the interior of plastic housing 12 in wall 12a of plastic housing 12. Electrically conductive plate system 16 extends up to its second end in wall 12a of plastic housing 12. At the second end of electrically conductive plate system 16, it is electrically connected to terminals 20 of semiconductor unit 14.

Figure 2A:
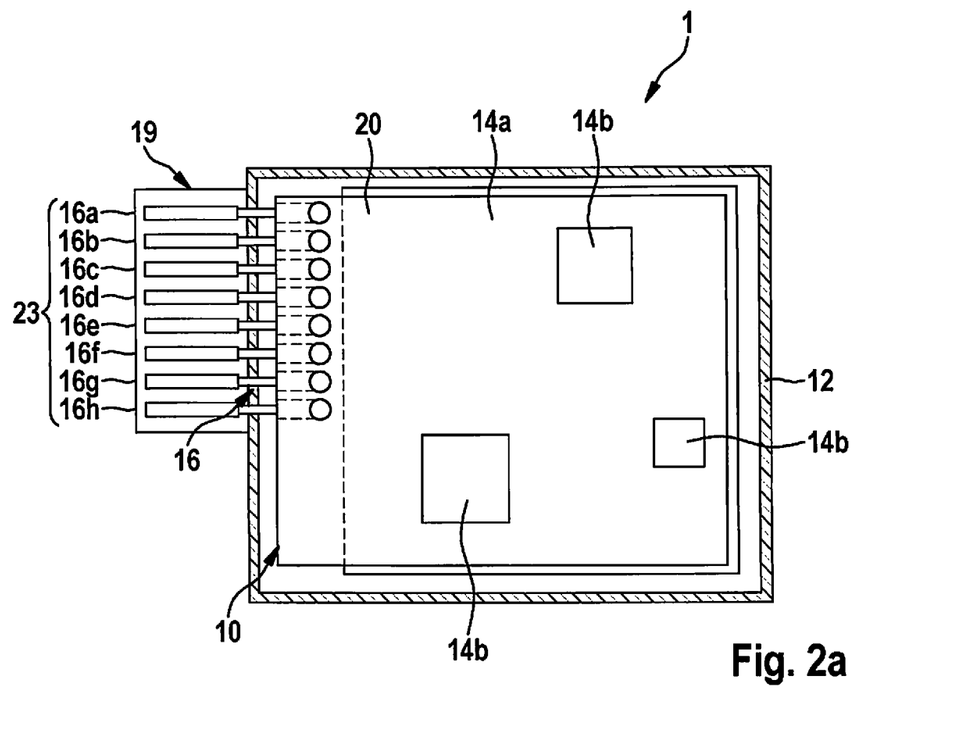
FIG. 2a shows a schematic view of the electronic module according to the present invention including the device for heat dissipation of heat generated by the semiconductor unit situated in the plastic housing, according to a second specific embodiment of the present invention.

FIG. 2a shows a schematic view of the electronic module according to the present invention including the device for heat dissipation of heat generated by the semiconductor unit situated in the plastic housing, according to a second specific embodiment of the present invention.

Electrically conductive plate system 16 has, according to the present second specific embodiment of the present invention, a first plate system 23, which supplies semiconductor unit 14 with electrical power. The lead frame preferably has multiple layers of metal strips, which are connected and/or stacked to form a lead frame packet. Alternatively, the lead frame may also be formed in one layer. Electrically conductive plate system 16 furthermore has a second plate system 24, which is situated separately from first plate system 23 and which dissipates heat generated by semiconductor unit 14 to plastic housing 12.

First plate system 23 has a plurality of electrically conductive plate elements 16a, 16b, 16c, 16d, 16e, 16f, 16g, 16h, which are each at least partially extrusion coated using the plastic housing, the plurality of electrically conductive plate elements 16a, 16b, 16c, 16d, 16e, 16f, 16g, 16h being situated at a first end on an outer side of plastic housing 12 in a plug region 19 and being electrically connected at a second end to terminals 20 of semiconductor unit 14. Second plate system 24 is planar, is at least partially extrusion coated using plastic housing 12, and covers a substantially predominant part of the area of the at least one wall 12a of plastic housing 12. According to the present second specific embodiment of the present invention, second plate system 24 preferably covers at least 80% of the area of the at least one wall 12a of plastic housing 12.

Semiconductor unit 14 is formed by a circuit board 14a and application-specific integrated circuits 14b, which are situated on circuit board 14a.

Figure 2B:
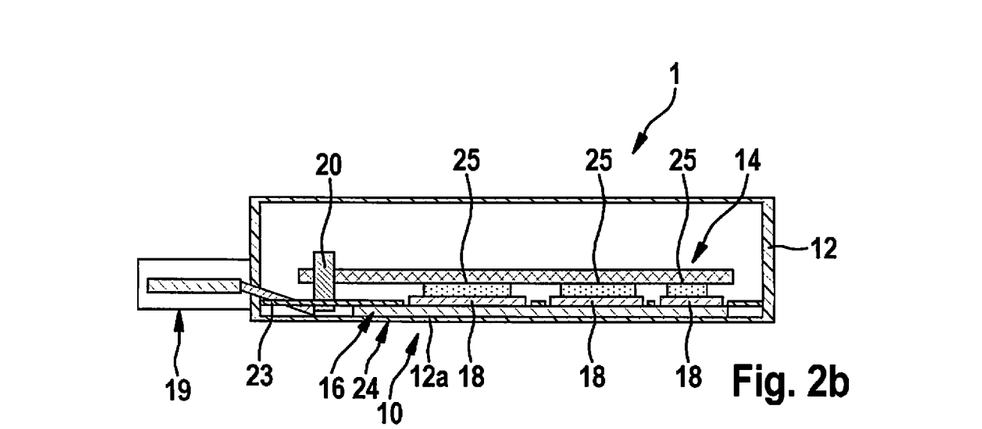
FIG. 2b shows a cross-sectional view of the electronic module according to the present invention including the device for heat dissipation of heat generated by the semiconductor unit situated in the plastic housing, according to a second specific embodiment of the present invention.

FIG. 2b shows a cross-sectional view of the electronic module according to the present invention including the device for heat dissipation of heat generated by the semiconductor unit situated in the plastic housing, according to a second specific embodiment of the present invention.

In contrast to the first specific embodiment of the present invention, the essential difference of the second specific embodiment is that electrically conductive plate system 16 is in two parts. First plate system 23 of electrically conductive plate system 16 is situated adjacent to plug area 19 and is at least partially extrusion coated using plastic housing 12. First plate system 23 extends from plug area 19 at its first end on the outer side of plastic housing 12 up to terminals 20 of semiconductor unit 14 at its second end.

Second plate system 24 is planar and is at least partially extrusion coated using plastic housing 12. Second plate system 24 is situated completely in wall 12 of the plastic housing. Second plate system 24 of electrically conductive plate system 16 is released on an inner side of plastic housing 12 at predetermined thermal connection areas 25 for the thermal connection of electrically conductive plate system 16 to semiconductor unit 14.

In the present second specific embodiment of the present invention, electrically conductive plate system 16 has three thermal connection areas 25. Alternatively, electrically conductive plate system 16 may also have another suitable number of connection areas 25. Heat coupler 18, via which electrically conductive plate system 16 is connected to semiconductor unit 14, is provided at particular thermal connection areas 25. Heat coupler 18 is preferably formed by a heat conducting gel. Alternatively, heat coupler 18 may also be formed by a heat pad or other suitable heat couplers.

Figure 3A:
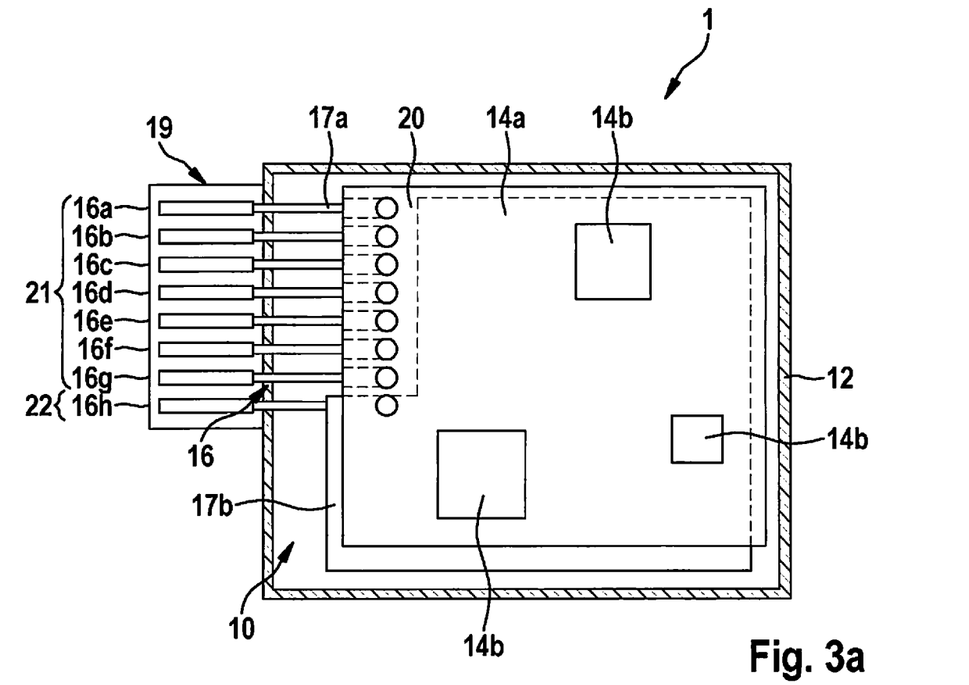
FIG. 3a shows a schematic view of the electronic module according to the present invention including the device for heat dissipation of heat generated by the semiconductor unit situated in the plastic housing, according to a third specific embodiment of the present invention.

FIG. 3a shows a schematic view of the electronic module according to the present invention including the device for heat dissipation of heat generated by the semiconductor unit situated in the plastic housing, according to a third specific embodiment of the present invention.

According to the third specific embodiment of the present invention, electrically conductive plate system 16 has a plurality of planar electrically conductive plate elements 16a, 16b, 16c, 16d, 16e, 16f, 16g, 16h, a first part 21 of the plurality of electrically conductive plate elements 16a, 16b, 16c, 16d, 16e, 16f, 16g, 16h supplying semiconductor unit 14 with electrical power and a second part 22 of the plurality of electrically conductive plate elements 16a, 16b, 16c, 16d, 16e, 16f, 16g, 16h supplying semiconductor unit 14 with electrical power and thus dissipating the heat generated by semiconductor unit 14 to plastic housing 12.

Second part 22 of the plurality of electrically conductive plate elements 16a, 16b, 16c, 16d, 16e, 16f, 16g, 16h has a larger area in comparison to an area of the plurality of electrically conductive plate elements 16a, 16b, 16c, 16d, 16e, 16f, 16g, 16h of the first part. Second part 22 of the plurality of electrically conductive plate elements 16a, 16b, 16c, 16d, 16e, 16f, 16g, 16h is preferably used as a ground line. The lead frame preferably has multiple layers of metal strips, which are connected and/or stacked to form a lead frame packet. Alternatively, the lead frame may also be formed in one layer. Semiconductor unit 14 is formed by a circuit board 14a and application-specific integrated circuits 14b situated on circuit board 14a.

Figure 3B:
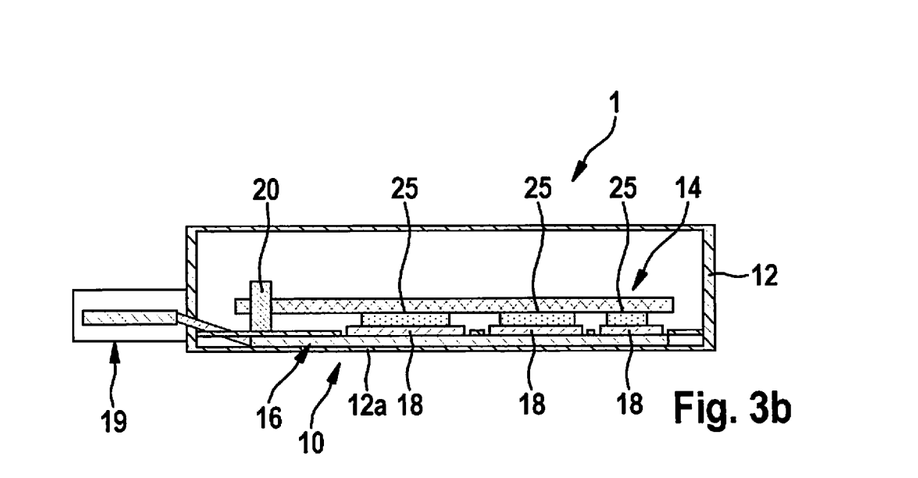
FIG. 3b shows a cross-sectional view of the electronic module according to the present invention including the device for heat dissipation of heat generated by the semiconductor unit situated in the plastic housing, according to the third specific embodiment of the present invention.

FIG. 3b shows a cross-sectional view of the electronic module according to the present invention including the device for heat dissipation of heat generated by the semiconductor unit situated in the plastic housing, according to the third specific embodiment of the present invention.

Electrically conductive plate system 16 is released on an inner side of plastic housing 12 in a thermal connection area 25 for the thermal connection of electrically conductive plate system 16 to semiconductor system 14. In the present first specific embodiment of the present invention, electrically conductive plate system 16 has three thermal connection areas 25. Alternatively, electrically conductive plate system 16 may also have another suitable number of connection areas 25.

Heat coupler 18, via which electrically conductive plate system 16 is connected to semiconductor unit 14, is provided at particular thermal connection areas 25. Heat coupler 18 is preferably formed by a heat conducting gel. Alternatively, heat coupler 18 may also be formed by a heat pad or other suitable heat coupling means.

Electrically conductive plate system 16 extends from plug area 19 into an inner area of plastic housing 12. Electrically conductive plate system 16 is extrusion coated using plastic housing 12 directly adjacent to plug area 19 in the interior of plastic housing 12 in wall 12a of plastic housing 12. Electrically conductive plate system 16 extends up to its second end in wall 12a of plastic housing 12. Electrically conductive plate system 16 is connected to terminals 20 in the interior of plastic housing 12, in an area adjacent to plug area 19.

Figure 4:
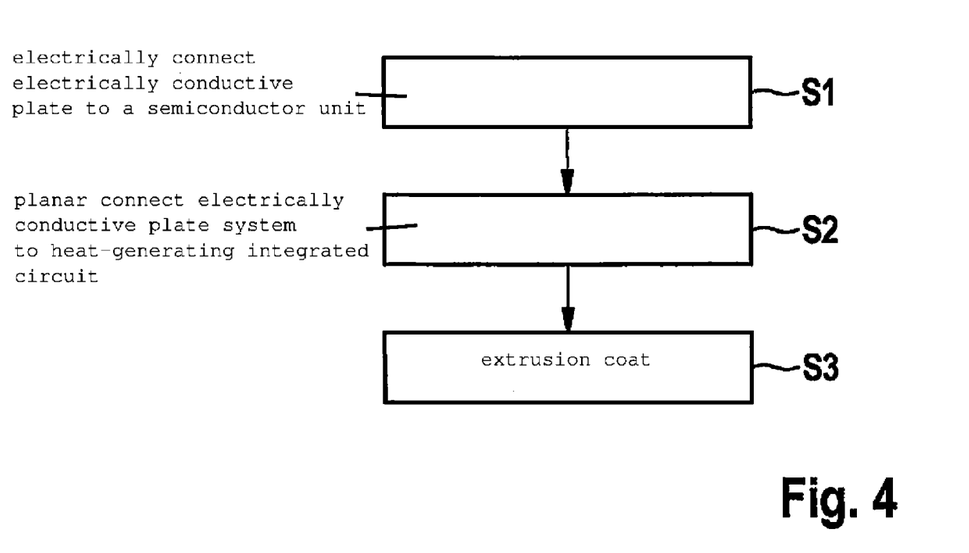
FIG. 4 shows a flow chart of a method for manufacturing an electronic module according to the present invention according to the first through third specific embodiments of the present invention.

FIG. 4 shows a flow chart of a method for manufacturing an electronic module according to the present invention according to the first through third specific embodiments of the present invention.

The method for manufacturing the electronic module includes an electrical connection S1 of an electrically conductive plate system 16 to a semiconductor unit 14, electrically conductive plate system 16 supplying semiconductor unit 14 with electrical power. The method furthermore includes planar connection S2 of electrically conductive plate system 16 to a heat-generating integrated circuit 14b of semiconductor unit 14 via a heat coupler 18.

The method additionally includes extrusion coating S3 of electrically conductive plate system 16, which is connected to heat-generating integrated circuit 14b of semiconductor unit 14 via heat coupler 18, using a plastic to form a plastic housing 12, electrically conductive plate system 16 dissipating the heat generated by heat-generating integrated circuit 14b of semiconductor unit 14 to plastic housing 12.

Although the present invention was described above on the basis of preferred exemplary embodiments, it is not restricted thereto, but rather is modifiable in manifold ways. In particular, the present invention may be changed or modified in manifold ways, without deviating from the core of the present invention.

For example, the dimensioning of the area of electrically conductive plate system 16, which is used for the heat dissipation of the heat generated by semiconductor unit 14, may be adapted to structural requirements or a required heat dissipation of semiconductor unit 14.

What is claimed is:

1. An electronic module, comprising:
    a semiconductor unit situated in a plastic housing;
    an electrically conductive plate system via which the semiconductor unit is supplied with electrical power, the electrically conductive plate system being connected in a planar fashion to a heat-generating integrated circuit of the semiconductor unit via a heat coupler, the electrically conductive plate system being designed in such a way that it dissipates the heat generated by the heat-generating integrated circuit of the semiconductor unit to the plastic housing, wherein the electrically conductive plate system includes a plurality of electrically conductive plate elements, the plurality of electrically conductive plate elements being electrically connected at one end to terminals of the semiconductor unit.

2. The electronic module as recited in claim 1, wherein the plurality of electrically conductive plate elements are each at least partially extrusion coated using the plastic housing and cover a substantially predominant part of an area of at least one wall of the plastic housing opposite to the heat-generating integrated circuit of the semiconductor unit.

3. The electronic module as recited in claim 2, wherein the plurality of electrically conductive plate elements cover at least 50% of the area of at least the wall of the plastic housing opposite to the heat-generating integrated circuit of the semiconductor unit.

4. The electronic module as recited in claim 2, wherein the plurality of electrically conductive plate elements cover at least 80% of the area of at least the wall of the plastic housing opposite to the heat-generating integrated circuit of the semiconductor unit.

5. The electronic module as recited in claim 2, wherein a first part of the plurality of electrically conductive plate elements has a first area and a second part of the plurality of electrically conductive plate elements has a second area, the second area being formed larger than the first area.

6. An electronic module, comprising:
   a semiconductor unit situated in a plastic housing; and
   an electrically conductive plate system via which the semiconductor unit is supplied with electrical power, the electrically conductive plate system being connected in a planar fashion to a heat-generating integrated circuit of the semiconductor unit via a heat coupler, the electrically conductive plate system being designed in such a way that it dissipates the heat generated by the heat-generating integrated circuit of the semiconductor unit to the plastic housing;
   wherein the electrically conductive plate system has a plurality of electrically conductive plate elements, which are each at least partially extrusion coated using the plastic housing and cover a substantially predominant part of an area of at least one wall of the plastic housing opposite to the heat-generating integrated circuit of the semiconductor unit;
   wherein the plurality of electrically conductive plate elements is arranged at a first end on an outer side of the plastic housing in a plug area of the plastic housing and is electrically connected at a second end to terminals of the semiconductor unit.

7. An electronic module, comprising:
   a semiconductor unit situated in a plastic housing; and
   an electrically conductive plate system via which the semiconductor unit is supplied with electrical power, the electrically conductive plate system being connected in a planar fashion to a heat-generating integrated circuit of the semiconductor unit via a heat coupler, the electrically conductive plate system being designed in such a way that it dissipates the heat generated by the heat-generating integrated circuit of the semiconductor unit to the plastic housing;
   wherein the electrically conductive plate system has a plurality of electrically conductive plate elements, a first part of the plurality of electrically conductive plate elements being designed in such a way that they supply the semiconductor unit with electrical power and a second part of the plurality of electrically conductive plate elements being designed in such a way that they supply the semiconductor unit with electrical power and dissipate heat generated by the semiconductor unit to the plastic housing.

8. An electronic module, comprising:
   a semiconductor unit situated in a plastic housing; and
   an electrically conductive plate system via which the semiconductor unit is supplied with electrical power, the electrically conductive plate system being connected in a planar fashion to a heat-generating integrated circuit of the semiconductor unit via a heat coupler, the electrically conductive plate system being designed in such a way that it dissipates the heat generated by the heat-generating integrated circuit of the semiconductor unit to the plastic housing;
   wherein the electrically conductive plate system has a first plate system, which is designed in such a way that it supplies the semiconductor unit with electrical power, and has a second plate system, which is situated separately from the first plate system and which is designed in such a way that it dissipates heat generated by the semiconductor unit to the plastic housing.

9. The electronic module as recited in claim 8,
   wherein the first plate system has a plurality of electrically conductive plate elements, which are each at least partially extrusion coated using the plastic housing, the plurality of electrically conductive plate elements being situated at a first end on an outer side of the plastic housing in a plug area of the plastic housing and being electrically connected at a second end to terminals of the semiconductor unit.

10. The electronic module as recited in claim 9, wherein the second plate system is at least partially extrusion coated using the plastic housing and covers a substantially predominant part of an area of at least one wall of the plastic housing, which is opposite to the heat-generating integrated circuit of the semiconductor unit.

11. The electronic module as recited in claim 10,
    wherein the second plate system covers at least 50% of the area of at least the wall of the plastic housing opposite to the heat-generating integrated circuit of the semiconductor unit.

12. The electronic module as recited in claim 10,
    wherein the second plate system covers at least 80% of the area of at least the wall of the plastic housing opposite to the heat-generating integrated circuit of the semiconductor unit.

13. The electronic module as recited in claim 1,
    wherein the electrically conductive plate system is released from the plastic housing in a thermal connection area to the heat coupler.

14. The electronic module as recited in claim 1, wherein the electrically conductive plate system is formed by a lead frame.

15. The electronic module as recited in claim 1, wherein the heat coupler is formed by a heat conducting gel or a heat pad.

16. The electronic module as recited in claim 1,
    wherein the semiconductor unit is formed by a circuit board and the integrated circuit situated on the circuit board.

17. A method for producing an electronic module, comprising:
    electrically connecting an electrically conductive plate system to a semiconductor unit, the electrically conductive plate system supplying the semiconductor unit with electrical power;
    planar connecting the electrically conductive plate system to a heat-generating integrated circuit of the semiconductor unit via a heat coupler; and
    extrusion coating the electrically conductive plate system connected via the heat coupler to the heat-generating integrated circuit of the semiconductor unit, the extrusion coating using a plastic to form a plastic housing, the electrically conductive plate system dissipating the heat generated by the heat-generating integrated circuit of the semiconductor unit to the plastic housing.

* * * * *